United States Patent [19]
Barrett

[11] Patent Number: 6,031,983
[45] Date of Patent: Feb. 29, 2000

[54] POST IMAGE TECHNIQUES

[75] Inventor: Geoff Barrett, Bristol, United Kingdom

[73] Assignee: SGS-Thomson Microelectronics Limited, Almondsbury Bristol, United Kingdom

[21] Appl. No.: 09/028,415

[22] Filed: Feb. 24, 1998

[30] Foreign Application Priority Data

Sep. 3, 1997 [GB] United Kingdom .................. 9718688

[51] Int. Cl.[7] ...................................................... G06F 17/11
[52] U.S. Cl. ........................................ 395/500.23; 714/37
[58] Field of Search .............................. 395/500.23, 500; 364/191, 578; 341/106, 107; 714/39, 37

[56] References Cited

U.S. PATENT DOCUMENTS

| | | | |
|---|---|---|---|
| 4,200,770 | 4/1980 | Hellman et al. . | |
| 4,376,299 | 3/1983 | Rivest . | |
| 5,258,919 | 11/1993 | Yamanouchi et al. | 395/500.12 |
| 5,272,755 | 12/1993 | Miyaji et al. . | |
| 5,311,521 | 5/1994 | Fitingof et al. | 714/755 |
| 5,325,433 | 6/1994 | Torii et al. . | |
| 5,327,544 | 7/1994 | Lee et al. | 395/500.23 |
| 5,331,568 | 7/1994 | Pixley | 395/500.04 |
| 5,475,388 | 12/1995 | Gormish et al. | 341/107 |
| 5,615,137 | 3/1997 | Holzmann et al. | 395/500.41 |
| 5,625,692 | 4/1997 | Herzberg et al. . | |
| 5,706,473 | 1/1998 | Yu et al. | 395/500.05 |
| 5,831,853 | 11/1998 | Bobrow et al. | 364/191 |

FOREIGN PATENT DOCUMENTS 0 653 716  5/1995  European Pat. Off. ........ G06F 17/50

OTHER PUBLICATIONS

M. Vai et al., "Qualitatively modeling heterojunction bipolar transistors for optimization: a neural network approach", IEEE/Cornell Conf. On Advanced Concepts in High Speed Semiconductor Devices and Circuits, 1993, pp. 219–227.

S. Wu et al., "A massively parallel reverse modeling approach for semiconductor devices and circuits", IEEE/Cornell Conf. On Advanced Concepts in High Speed Semiconductor Devices and Circuits, 1997, pp. 201–209.

M. Vai et al.,, "Reverse modeling of microwave circuits with bidirectional neural network models", IEEE Transactions on Microwave Theory and Techniques, vol. 46, No. 10, Oct. 1998, pp. 1492–1494.

Takahara et al., A Higher Level Hardware Design Verification, 1988 IEEE International Conference on Computer Design: VLSI Computers & Processors, New York, Oct. 3–5, 1988, pp. 596–599.

Coudert et al., Verification of Sequential Machines Using Boolean Functional Vectors, International Workshop on Applied Methods for Correct VLSI Design, Dec. 13, 1989, Houthalen (1989) Leuven, BE.

Jain et al., Hierarchical Constraint Solving in the Parametric Form with Application to Efficient Symbolic Simulation based Verification, IEEE, 1993, pp. 304–307.

Aziz et al., Minimizing Interacting Finite State Machines: A Compositional Approach to Language Containment, IEEE, 1994, pp. 255–261.

(List continued on next page.)

*Primary Examiner*—Kevin J. Teska
*Assistant Examiner*—Russell W. Frejd
*Attorney, Agent, or Firm*—Wolf, Greenfield & Sacks, P.C.; James H. Morris; Theodore E. Galanthay

[57] ABSTRACT

A device for synthesizing a reverse model of a system includes a first store storing bits representative of transition functions of the system, a second store storing bits representative of an estimate of transition functions of the reverse model, and processing system. The processing system comprises a logical device for transforming the transition functions of the system into constraints on the reverse model, and a parameterization processor for applying a parameterization of the constraints to the estimate of transition functions of reverse system to form transition functions of the reverse model.

3 Claims, 1 Drawing Sheet

OTHER PUBLICATIONS

Standard Search Report issued by the European Patent Office, dated Nov. 11, 1997.

Hu A.J., et al., "New Techniques For Efficient Verification With Implicitry Conjoined BDDS", Proceedings Of The Design Automation Conference, San Diego, Jun. 6–10, 1994, no. Conf. 31, Jun. 6, 1994, Institute of Electrical and Electronics Engineers, pp. 276–282.

Wuxu P., et al., "Reachability and Reverse Reachability Analysis of CFSMs", Computer Communications, vol. 19, No. 8, Jul. 1996, pp. 668–674.

POST IMAGE TECHNIQUES

BACKGROUND OF THE INVENTION

1. Field of the Invention

The present invention relates to a technique for deriving properties of a system, and more especially but not exclusively to a technique for deriving properties of a hardware system using a model of the system.

2. Description of the Prior Art

When seeking to derive the properties of a system on the basis of known transition functions of the system and all of the possible starting states, it is known to use so-called "post-image" techniques to derive the reachable states of the system. A known set of initial states is selected and the post-image of that initial set is formed to provide a first reachable set. The first reachable set is compared to the known set of reachable states and, if the known set does not comprise the first reachable set, a new set of known reachable states is formed comprising the combination of the set of reachable states and the first reachable set. If however the known set of reachable states comprises the first reachable set, the set of reachable states is determined to be an invariant of the system, and computation ceases.

Where the system model is a set of transition functions, it would be considerably more efficient to produce the so-called "pre-image" of a set of states than it would be to produce the post-image. In simple terms, where each of several inputs to a system causes one of a set of outputs, a worst case for testing which input provided one particular output of interest would require all of the inputs to be applied in turn before it was possible to identify the input that gave rise to the particular output.

SUMMARY OF THE INVENTION

The present invention derives transition functions for a reverse machine i.e. a machine such that the post image of the reverse machine will be the pre image of the original system.

According to a first aspect of the present invention there is provided a method of calculating the post image in a system, the method comprising:

forming a reverse model of the system; and calculating the pre image in said reverse model, wherein the pre image in said reverse model is equivalent to the post image in said system.

According to a second aspect of the present invention there is provided a method of synthesising a reverse model of a system comprising:

transforming a transition function of the system into a constraint on the reverse model; and applying a parameterisation of said constraint to all transitions of the reverse model.

According to a third aspect of the present invention there is provided a device for synthesising a reverse model of a system comprising:

a first store storing bits representative of transition functions of said system;

a second store storing bits representative of an estimate of transition functions of said reverse model; and processing means, said processing means comprising:

logical means for transforming said transition functions of said system into constraints on said reverse model; and parameterisation means for applying a parameterisation of said constraints to said estimate of transition functions of said reverse system to form transition functions of said reverse model.

According to a fourth aspect of the present invention there is provided a device for calculating the post image in a system having:

a third store storing bits representative of transition functions of a reverse model of said system;

a fourth store storing bits representative of a set of states of said system; and logical means substituting the state variables of the reverse model by the transition functions of the reverse model to provide a new set of states representing the pre image of said reverse system, and thus the post image in said system.

Preferably the device further comprises a first store storing bits representative of transition functions of said system;

a second store storing bits representative of an estimate of transition functions of said reverse model;

logical means for transforming said transition functions of said system into constraints on said reverse models; and parameterisation means for applying a parameterisation of said constraints to said estimate of transition functions of the reverse system to form transition functions of said reverse model.

Preferably said estimate of transition functions of said reverse model comprises previous state variables of said system.

BRIEF DESCRIPTION OF THE DRAWINGS

In the figures like reference numerals refer to like parts.

DETAILED DESCRIPTION OF THE PREFERRED EMBODIMENT

In this example, a two bit counter is used to demonstrate a technique for modelling a reverse machine. It will be clear to one skilled in the art that if the real machine is a conventional counter which counts up, then the reverse machine will be a machine which counts down.

It will also be clear to one skilled in the art that for the simplified examples selected here, properties would normally be proved by using only a pre-image calculation. Post image calculation could be used for example to calculate the set of reachable states, namely all states which could be reached by a particular machine. In this situation, a typical method would be to start with a set of initial states, calculate the post image and add the states resulting in the post image to the original set. This would then be repeated until no new states were found and the resultant would be the set of reachable states.

Although it will be clear to one skilled in the art that for a two bit counter have states (0,0), (0,1), (1,0) and (1,1) the set of reachable states would comprise the set of all these states, the following description gives an example of the construction of a reverse machine which enables the use of pre-image calculation on that reverse machine to prove this.

Figure 1:
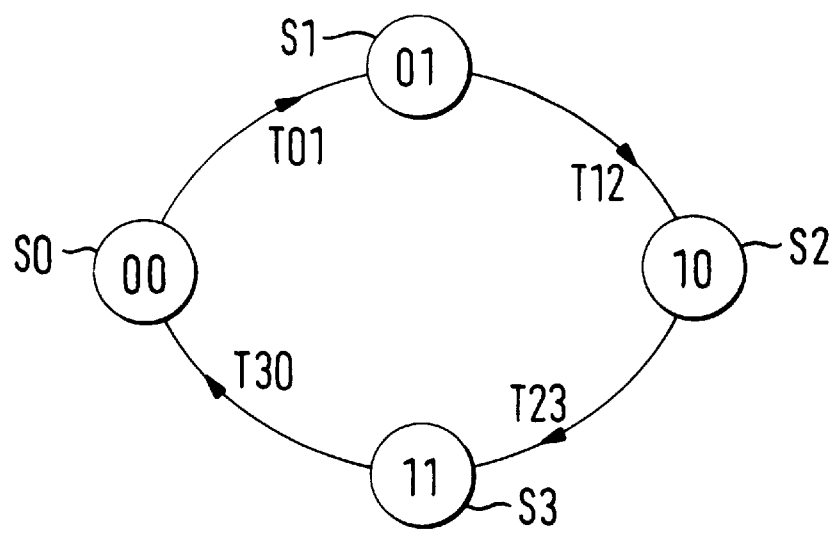
FIG. 1 shows a two bit counter as a finite state machine.

Referring to FIG. 1, a two bit counter has four states S0, S1, S2 and S3. The transition from S0 to S1 is T01 the transition from state S1 to state S2 is T12, the transition from S2 to S3 is T23 and the transition from S3 to S0 is T30.

At state S0, the bits of the counter are both equal to zero (i.e. b0=0 and b1=0, where b0 is the least significant bit and b1 is the most significant bit). In state S1, the counter has b0=1 and b1=0, in state S2 b0=0 and b1=1, and in state S3 b1=1 and b0=1.

The state transition functions are formed as follows:

1. For the least significant bit, a transition from one state to the next causes the least significant bit to be inverted, i.e.
   b0=NOT b0.
2. For the most significant bit, this has a value of logic 1, i.e. true where the previous state is S1 or S2. For S1, b0 is true and b1 is false and for S2 b0 is false and b1 is true. Thus,
   b1=(NOT b0 AND b1)OR(b0 AND NOT b1).

As applied to this counter, an example of the use of the invention is to prove that only a transition from state S1 can directly result in state S2.

The invention accordingly provides a method and apparatus for synthesising a reverse model of a finite state machine. This will be demonstrated using the finite state machine shown in FIG. 1, i.e. synthesising a reverse counter.

To do this, it is first necessary to note that for a reverse machine, transitions would take place in the reverse direction to those shown in FIG. 1. Thus, for the reverse machine, the next state of that reverse machine is in fact the previous state of the real machine. Thus, after a transition from b0 in the reverse machine, the result is a new value equal to b0' and a transition in the reverse machine from b1 results in a new value of b1' where the notation "'" indicates the previous state of the real machine.

Applying the transition functions of the real state machine to the transitions of the reverse machine to form constraints:

b0=NOT b0'  (1)

b1=(NOT b0' AND b1') OR (b0' AND NOT b1')  (2)

From our British Application No 9624935.4, it was shown that if a constraint is given by (NOT I AND T0) OR (I AND T1)  (3)

where I is an input and neither T0 nor T1 depend on I, then I can be generated by parameterisation of this equation to provide a new input J which satisfies the relation

I=(NOT J AND NOT T0) OR (J AND T1)  (4)

An equation for b0' is now generated using the constraint (1) and the parameterisation technique so that:

b0'=(NOT b0" AND NOT [b0=1]) OR (b0" AND [b0=0])

=NOT b0

Substituting this equation in constraint (2) gives
 b1=(b0 AND b1') OR (NOT b0 AND NOT b1') or, equivalently:
 (b1' AND [b0=b1]) OR (NOT b1' AND NOT [b0=b1])
By using this equation, an equation for b1' can be generated by the parameterisation technique, whereby:
 b1' =(NOT b1" AND [b0=b1]) OR (b1" AND [b0=b1])
  thus b1'=[b0=b1]
The transitions of the reverse machine are now such that the value of b0 on the next cycle is calculated as NOT b0, and the value of b1 on the next cycle is calculated as b0=b1.

By substituting in the relationship (3) above:
 b1'=(b0 AND b1) or (NOT b0 AND NOT b1).
Thus, the transition functions for the reverse machine give the following relationships:
For bit 0: After a transition in the forward direction for the reverse machine, the new value of bit 0 will be true if the starting value of bit 0 were false.

In the context of the real machine, as has previously been explained, a forward transition of the reverse machine is identical to a reverse transition of the real machine. Thus, the above can be restated as:

The previous value of the bit 0 of the real machine is true if the present value of bit 0 of the real machine is false.
For bit 1: Using the bit 0 relationship above:
 the previous value of bit 1 for the real machine is true if the present bit 0 and the present bit 1 are both true or if the present value of bit 0 and the present value of bit 1 are both false.

More generally, in a model checker based on the transition relation, the formula for the calculation of the post-image of a set of states is very similar to the formula for the calculation of the pre-image (pre(X)=∃S':X[S:=S'] & R and Post(X)=(∃S: X & R) [S':=S]), where the following notation applies:
 X[V:=E] substitutes the expressions E for the variables V in the predicate X
 599 V:X existential quantification of the variables V in the predicate X.

However, in a model checker based on transition functions, the post-image formula is complicated and difficult to implement efficiently. This section will show how to provide transition functions for the reverse machine (i.e. one in which transitions go from the current state to the previous state), and therefore the pre-image of the reverse system will be the post-image of the original system.

Let the state variables and transition functions of the machine be S and T (observation functions are not considered), then the reverse system is constructed as follows. First note that S' (the next-state variables of the reverse system) correspond to the previous states of the original system. Beginning with the transitions of the reverse system being T', the transition functions of the original system are used to constrain them. Thus, for each state s and transition t, there is a constraint S==t[S:=S']. Call the set of constraints C. For each constraint, the parameterisation E over the variables S', is calculated and this is substituted in the transition functions and the remaining constraints.

The parameterisation is an idempotent parameterisation i.e. a parameterisation which after being affected, leaves the relationship entirely unaltered.

Figure 2:
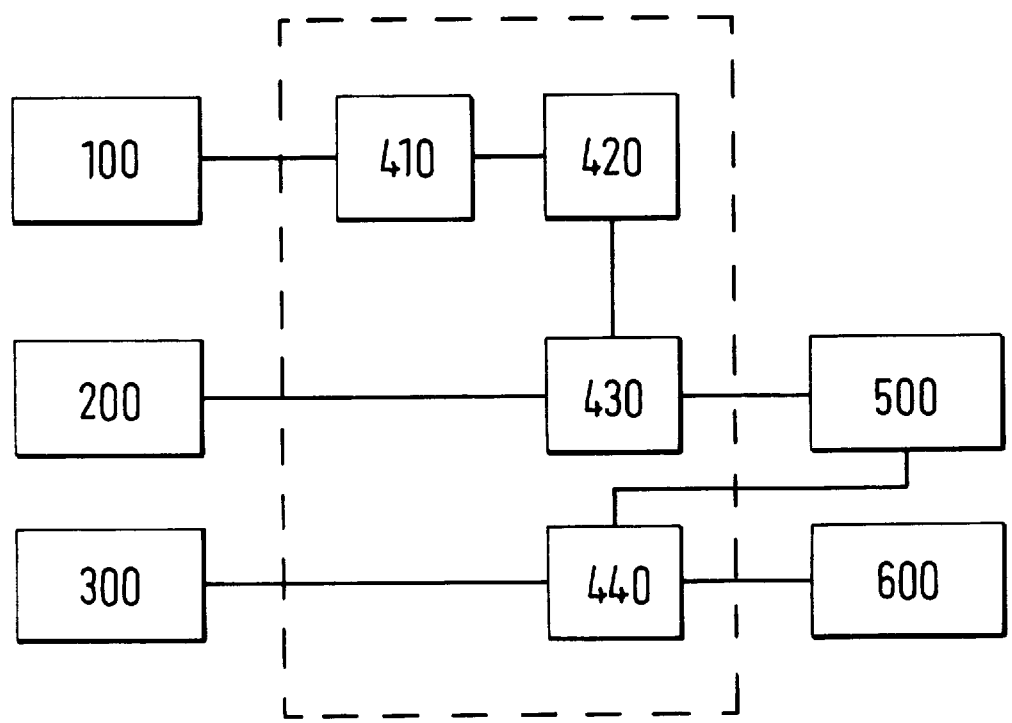
FIG. 2 shows a schematic diagram of a system for proving the properties of the hardware system.

Referring to FIG. 2, a first store 100 stores bits representative of transition functions of a system. A second store 200 stores bits representative of estimated transition function of a reverse model of said system, the estimate being derived from knowledge of the next-state variables of the reverse system, which of course correspond to the previous state variables of the original system. A third store 300 stores bits representative of the set of state variables of the system, which necessarily is also the set of state variables of the reverse model.

A processor means 400 has a logical transforming device 410 which receives the transition functions of the real machine from the first store 100 and transforms the transition functions into constraints on the reverse model. The processor further has a parameterisation processing device 420 for calculating for each constraint the parameterisation over the variables of the reverse machine which are then applied to the estimated transition functions of the reverse machine in applying means 430. The applying means 430 provides an output to a fourth store 500 which stores the actual transition functions of the reverse model.

A processor 400 further includes a forming device 440 which receives the state variables of the real/reverse models from the third store 300 and also receives the transition functions of the reverse machine from the fourth store 500 and acts to substitute the state variables of the reverse machine with the transition functions of the reverse machine to provide a new set of states which represent the pre image of the reverse system thus the post image of the second system. This data is stored in fifth store 600.

The above description is of one embodiment of the present invention only and is to enable a full understanding of the invention while not intending to limit the invention. The scope of the invention can be ascertained from the appended claims.

We claim:

1. A device for calculating a post-image in a system, the device comprising:

a first store arranged to store bits representative of transition functions of the system;

a second store arranged to store bits representative of an estimate of transition functions of a reverse model;

a processing system constructed and arranged to form transition functions of said reverse model without knowing input states and corresponding output states of the system, said processing system comprising a logical device constructed and arranged to transform said transition functions of said system into constraints on said reverse model; and a parameterization processor constructed and arranged to apply a parameterization of said constraints to said estimate of transition functions of said reverse model to form said transition functions of said reverse model;

a third store arranged to store bits representative of the transition functions of said reverse model of said system;

a fourth store arranged to store bits representative of a set of states of said system; and a forming device constructed and arranged to substitute the state variables of the reverse model by the transition functions of said reverse model to provide a new set of states representing a pre-image of said reverse model, and thus the post-image in said system.

2. A device as claimed in claim 1 wherein said estimate of transition functions of said reverse model comprises previous state variables of said system.

3. A device for calculating a post-image in a system, the device comprising:

first means for storing bits representative of transition functions of the system;

second means for storing bits representative of an estimate of transition functions of a reverse model;

processing means for forming transition functions of said reverse model without knowing input states and corresponding output states of the system, including logical means for transforming the transition functions of said system into constraints on said reverse model; and parameterization means for applying a parameterization of said constraints to said estimate of transition functions of said reverse model to form said transition functions of said reverse model;

third means for storing bits representative of the transition functions of said reverse model of said system;

fourth means for storing bits representative of a set of states of said system; and forming means for substituting the state variables of the reverse model by the transition functions of said reverse model to provide a new set of states representing a pre-image of said reverse model, and thus the post-image in said system.

* * * * *

UNITED STATES PATENT AND TRADEMARK OFFICE
CERTIFICATE OF CORRECTION

PATENT NO. : 6,031,983
DATED : February 29, 2000
INVENTOR(S) : Geoff Barrett

It is certified that error appears in the above-identified patent and that said Letters Patent is hereby corrected as shown below:

Column 4, line 27 should read:

∃ V:X existential quantification of the variables V in the

Signed and Sealed this

Twenty-first Day of November, 2000

Attest:

Q. TODD DICKINSON

*Attesting Officer*         *Director of Patents and Trademarks*